United States Patent
Meruva et al.

(10) Patent No.: US 12,302,537 B2
(45) Date of Patent: May 13, 2025

(54) METHODS AND SYSTEMS FOR PRIORITIZING MAINTENANCE OF COOLING UNITS OF A DATA CENTER

(71) Applicant: Honeywell International Inc., Charlotte, NC (US)

(72) Inventors: Jayaprakash Meruva, Bangalore (IN); Madhav V Kamath, Bengaluru (IN); Magesh Lingan, Bangalore (IN); Srikanth Nagaraj, Bangalore (IN)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 370 days.

(21) Appl. No.: 17/746,670

(22) Filed: May 17, 2022

(65) Prior Publication Data

US 2023/0380115 A1    Nov. 23, 2023

(51) Int. Cl.
H05K 7/20    (2006.01)

(52) U.S. Cl.
CPC ..... H05K 7/20836 (2013.01); H05K 7/20745 (2013.01)

(58) Field of Classification Search
USPC ........................................................ 702/184
See application file for complete search history.

(56) References Cited

U.S. PATENT DOCUMENTS

| | | | |
|---|---|---|---|
| 8,423,322 B2 | 4/2013 | Steinberg et al. | |
| 9,256,846 B2 | 2/2016 | Stluka et al. | |
| 9,568,923 B1 | 2/2017 | Demetriou et al. | |
| 9,678,518 B2 | 6/2017 | Boesveld et al. | |
| 9,995,501 B2 | 6/2018 | Quam et al. | |
| 10,065,143 B2 | 9/2018 | Beier | |
| 10,410,502 B2 | 9/2019 | Federspiel et al. | |
| 10,574,529 B2 | 2/2020 | Marinelli et al. | |
| 11,079,731 B2 | 8/2021 | Khurana et al. | |
| 11,284,544 B1 | 3/2022 | Lingle et al. | |
| 2007/0156373 A1* | 7/2007 | Yamashita | F24F 11/38 702/182 |

(Continued)

FOREIGN PATENT DOCUMENTS

| CN | 108592352 B | 9/2020 |
|---|---|---|
| WO | 2016111719 A1 | 7/2016 |

(Continued)

OTHER PUBLICATIONS

GB Search Report Under Section 17, Intellectual Property Office, GB Application No. 2306348.0, Oct. 25, 2023 (4 pages).

(Continued)

*Primary Examiner* — John H Le
(74) *Attorney, Agent, or Firm* — Seager, Tufte & Wickhem, LLP

(57) ABSTRACT

An example may be found in a method of identifying one or more cooling units of a plurality of cooling units servicing a data center that has a reduced relative performance level relative to other of the plurality of cooling units. The method includes monitoring a performance level of each of the plurality of cooling units and comparing the performance level to that of neighboring cooling units. In response to determining that at least one of the respective cooling units has a reduced relative performance level, an alert is issued.

17 Claims, 12 Drawing Sheets

(56) References Cited

U.S. PATENT DOCUMENTS

| | | | |
|---|---|---|---|
| 2010/0312415 A1* | 12/2010 | Loucks | H05K 7/20836 700/300 |
| 2011/0063796 A1 | 3/2011 | Huettner et al. | |
| 2014/0014292 A1* | 1/2014 | Rice | H05K 7/20836 165/279 |
| 2014/0188434 A1* | 7/2014 | Steinbrecher | G05B 23/0283 702/184 |
| 2016/0132839 A1 | 5/2016 | Randolph | |
| 2017/0115675 A1* | 4/2017 | Demetriou | G05D 23/1902 |
| 2017/0308802 A1 | 10/2017 | Ramsøy et al. | |
| 2018/0213684 A1* | 7/2018 | Bailey | F25B 49/022 |
| 2020/0089176 A1 | 3/2020 | Wacker | |
| 2020/0100394 A1 | 3/2020 | Albinger et al. | |
| 2020/0208862 A1 | 7/2020 | Mikulica et al. | |
| 2021/0329812 A1 | 10/2021 | Morgan et al. | |
| 2021/0333770 A1 | 10/2021 | Khurana et al. | |

FOREIGN PATENT DOCUMENTS

| | | |
|---|---|---|
| WO | 2019051077 A1 | 3/2019 |
| WO | 2021203037 A1 | 10/2021 |

OTHER PUBLICATIONS

The Must-Have Cooling Solution That Pays for Itself, Data Center, Vigilent, pp. 1-5. Accessed May 17, 2022.

Dynamic Control, Optimized Cooling, Dynamic Control, Vigilent, pp. 1-5. Accessed May 17, 2022.

See Your Data Center Differently, Monitoring, Vigilent, pp. 1-5. Accessed Feb. 15, 2022.

Uptime Protection for Mission Critical Sites, Uptime Protection, Vigilent, pp. 1-4. Accessed Feb. 15, 2022.

Extended European Search Report, EP Application No. 23171001.3, European Patent Office, Oct. 4, 2023 (9 pgs).

* cited by examiner

METHODS AND SYSTEMS FOR PRIORITIZING MAINTENANCE OF COOLING UNITS OF A DATA CENTER

TECHNICAL FIELD

The present disclosure pertains generally to cooling units of a data center and more particularly to prioritizing maintenance of the cooling units of a data center.

BACKGROUND

A data center typically includes a number of computer servers in close proximity to each other arranged in server racks. Because of the heat generated by having a number of computer servers in close proximity to each other, a data center includes numerous cooling equipment such as CRAC (computer room air conditioners) units and/or CRAH (computer room air handlers) units in order to control environmental conditions such as temperature within and around each of the server racks. Cooling units such as CRAC units and CRAH units undergo periodic maintenance. In some cases, a cooling unit may develop problems outside of a periodic maintenance schedule, which can increase maintenance costs by requiring non-scheduled visits by service personnel and in some cases non-scheduled down time of part of the data center. A need remains for improved methods and systems of anticipating and scheduling maintenance for the cooling units of a data center.

SUMMARY

This disclosure relates generally to improved methods and systems for anticipating and scheduling maintenance for the cooling units of a data center. An example may be found in a method of identifying one or more cooling units of a plurality of cooling units servicing a data center that has a reduced relative performance level relative to other of the plurality of cooling units. The illustrative method includes monitoring a performance level of each of the plurality of cooling units. The illustrative method further includes, for each of the plurality of cooling units, identifying one or more of the plurality of cooling units as one or more neighboring cooling units to the respective cooling unit, wherein the one or more neighboring cooling units to the respective cooling unit include less than all of the remaining ones of the plurality of cooling units of the data center, comparing the performance level of the respective cooling unit to the performance level of each of the one or more neighboring cooling units, determining that the respective cooling unit has a reduced relative performance level relative to the neighboring cooling units when the performance level of the respective cooling unit falls below the performance level of one or more of the neighboring cooling units by at least a threshold amount, and in response to determining that at least one of the respective cooling units has a reduced relative performance level, issuing an alert.

Another example may be found in a method of scheduling maintenance for a plurality of cooling units of a data center. The illustrative method includes receiving a plurality of sensor signals from a plurality of sensors and training a machine learning model based at least in part on the plurality of sensor signals to model a performance level of each of the plurality of cooling units and a degradation in the performance level of each of the plurality of cooling units over time. The method includes using a machine learning engine that references the trained machine learning model and the plurality of sensor signals to identify one or more of the plurality of cooling units that has a degradation in the performance level (which may include a projected degradation in the performance level based on the trained machine learning model) that is greater than the degradation in the performance level (which may include a projected degradation in the performance level based on the trained machine learning model) of at least one other of the plurality of cooling units by at least a threshold amount. A maintenance schedule is created for the plurality of cooling units, wherein the maintenance schedule prioritizes the one or more of the plurality of cooling units identified as having a degradation in the performance level that is greater than the degradation in the performance level of at least one other of the plurality of cooling units by at least a threshold amount. Maintenance is performed on the plurality of cooling units according to the maintenance schedule.

Another example may be found in instructions stored on a non-transient computer readable storage medium. When the instructions are executed by one or more processors, the one or more processors are caused to receive a plurality of sensor signals from a plurality of sensors and to derive a performance level of each of a plurality of cooling units servicing a data center based at least in part on the plurality of sensor signals. The one or more processors are caused to identify one or more of the plurality of cooling units that has a degradation in the performance level that is greater than the degradation in the performance level of at least one other of the plurality of cooling units by at least a threshold amount. The one or more processors are caused to create a maintenance schedule for the plurality of cooling units, wherein the maintenance schedule prioritizes the one or more of the plurality of cooling units identified as having a degradation in the performance level that is greater than the degradation in the performance level of at least one other of the plurality of cooling units by at least a threshold amount.

The preceding summary is provided to facilitate an understanding of some of the features of the present disclosure and is not intended to be a full description. A full appreciation of the disclosure can be gained by taking the entire specification, claims, drawings, and abstract as a whole.

BRIEF DESCRIPTION OF THE DRAWINGS

The disclosure may be more completely understood in consideration of the following description of various illustrative embodiments of the disclosure in connection with the accompanying drawings, in which.

Figure 1:
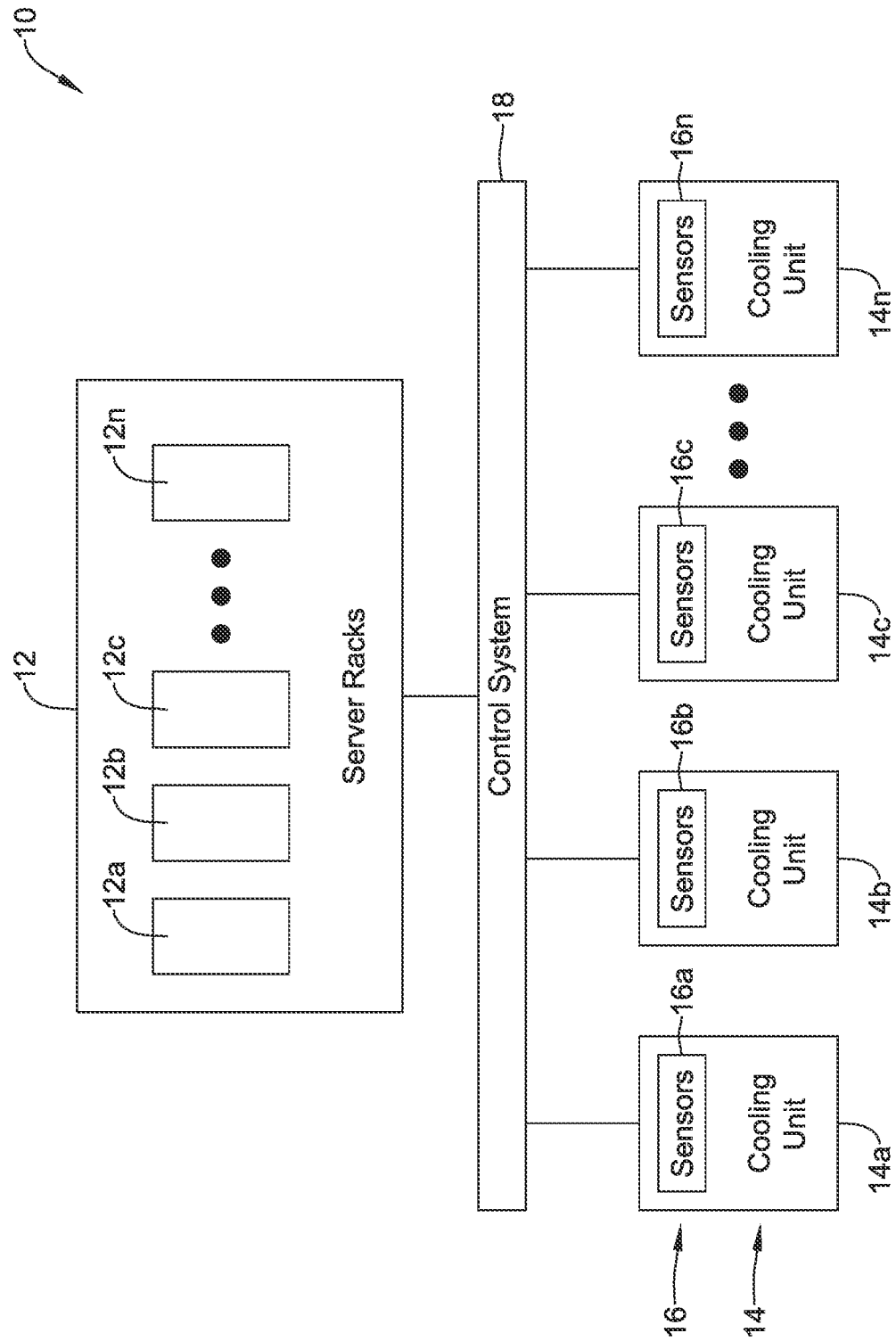
FIG. 1 is a schematic block diagram showing an illustrative data center.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

FIG. 1 is a schematic block diagram of an illustrative data center 10. The illustrative data center 10 includes a number of server racks 12, individually labeled as 12a, 12b, 12c and through 12n. The data center 10 may include any number of server racks 12. Each of the server racks 12 may include a plurality of individual computer servers, sometimes referred to as server blades. It will be appreciated that having a large number of computer servers in a confined space can generate significant heat. As a result, the data center 10 includes a number of cooling units 14, individually labeled as 14a, 14b, 14c and through 14n. In some cases, at least some of the cooling units 14 may be CRAC (computer room air conditioner) units. In some cases, at least some of the cooling units 14 may be CRAH (computer room air handler) units.

In some cases, there may be a particular cooling unit 14 assigned to a particular server rack 12. In some cases, a particular cooling unit 14 may be assigned to two or more server racks 12. In some instances, two or more cooling units 14 may be assigned to a single server rack 12. These are just examples.

Each of the cooling units 14 include one or more sensors 16, individually labeled as 16a, 16b, 16c and through 16n. Each sensor 16 may be a single sensor. Each sensor 16 may represent two or more different sensors within or associated with a particular cooling unit 14. Some of the sensors 16 may be air flow sensors, configured to measure air flow before and after a filter or other component of one of the cooling units 14. Some of the sensors 16 may be temperature sensors, configured to measure the temperature of cooling water before and after a cooling coil, for example. Some of the sensors 16 may be humidity sensors, particular matter (PM) sensors, CO sensors and/or any other suitable sensor useful in controlling the environment within the data center 10.

The sensors 16 and the cooling units 14 may be operably coupled with a control system 18. The control system 18 may control operation of the cooling units 14 in order to maintain the data center 10 and the server racks 12 within a desired environmental range (e.g. temperature range and/or humidity range). In some instances, the control system 18 may also regulate operation of the server racks 12, such as fans associated with the server racks. In some cases, the control system 18 may be locally situated within the data center 10, and may be implemented within one or more edge devices. In some cases, the control system 18 may be located remote from the data center 10, and may be disposed within a cloud-based server. In some cases, the control system 18 may be implemented within one or more server blades disposed within one of the server racks 12. In some cases, the control system 18 may be a distributed control system, with some features implemented locally (e.g. at the edge) and other features implemented remotely (e.g. in the cloud).

In some instances, the control system 18 may implement a number of different methods in determining which cooling units 14 are in need of maintenance, and when that maintenance should be performed in order to provide optimal performance of the cooling units 14 and thus the data center 10. The following figures provide examples of such methods.

Figure 2:
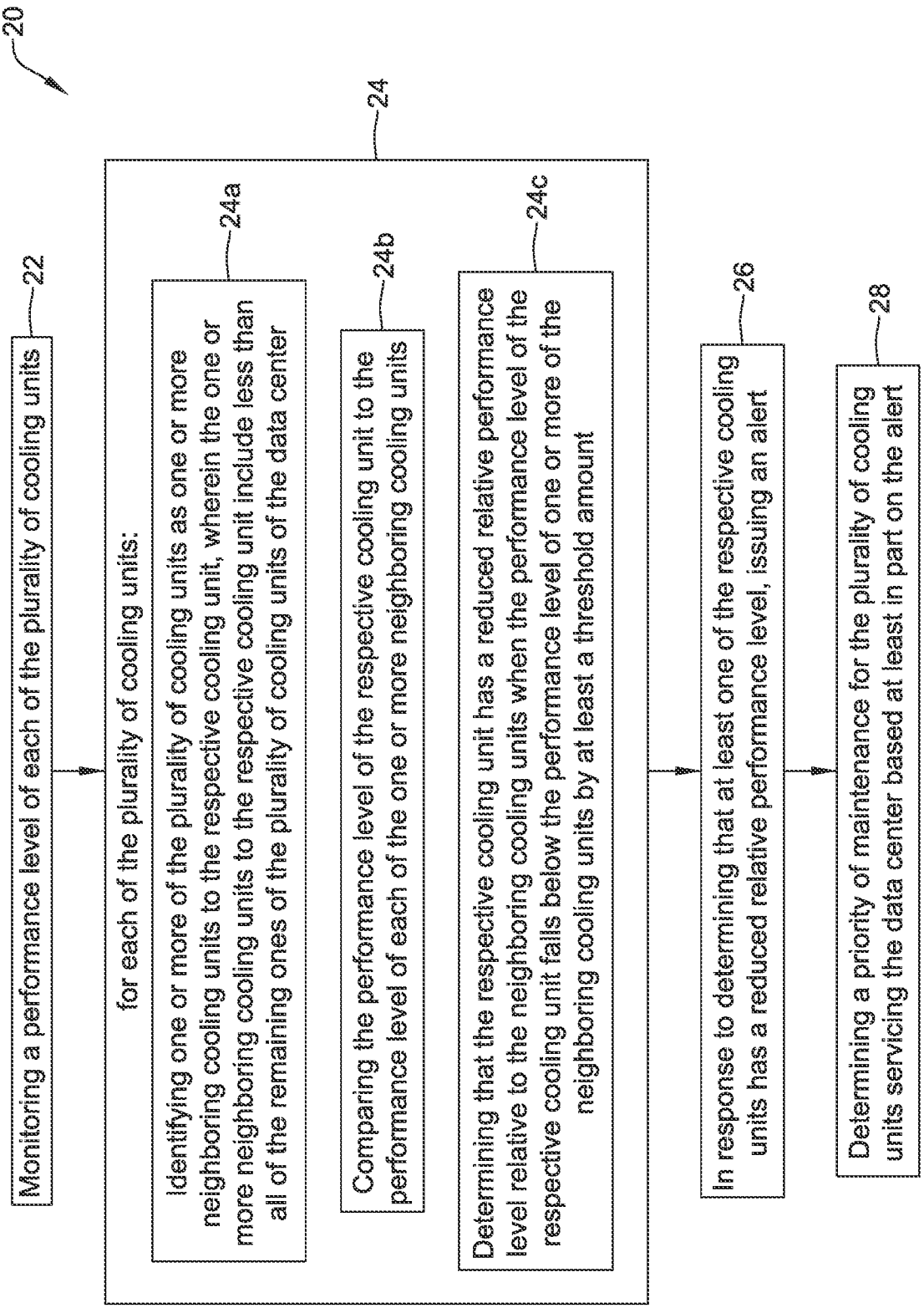
FIG. 2 is a flow diagram showing an illustrative method.

FIG. 2 is a flow diagram showing an illustrative method 20 of identifying one or more cooling units of a plurality of cooling units (such as the cooling units 14) servicing a data center (such as the data center 10) that has a reduced relative performance level relative to other of the plurality of cooling units. The method 20 includes monitoring a performance level of each of the plurality of cooling units, as indicated at block 22. In some cases, the performance level that is monitored may include an airflow parameter indicative of an air flow through an air filter of the respective cooling unit. The performance level that is monitored may include a temperature drop across a cooling coil of the respective cooling unit. These are just examples.

For each of the plurality of cooling units, as indicated at block 24, a number of steps are carried out. One or more of the plurality of cooling units are identified as one or more neighboring cooling units to the respective cooling unit, wherein the one or more neighboring cooling units to the respective cooling unit include less than all of the remaining ones of the plurality of cooling units of the data center, as indicated at block 24a. The one or more neighboring cooling units may be defined using any suitable criteria. For example, the one or more of the plurality of cooling units identified as neighboring cooling units to the respective cooling unit may be predefined for each respective cooling unit in advance during commissioning of the data center 10. For example, the one or more of the plurality of cooling units identified as neighboring cooling units to the respective cooling unit may be predefined based on having a nearby physical or logical location to the respective cooling unit, such as on a same floor of the data center 10 and/or in a same zone of the data center 10. In another example, the one or more of the plurality of cooling units identified as neighboring cooling units to the respective cooling unit may be predefined based on having an expected heat load that is within a defined heat load range. In some cases, the one or more of the plurality of cooling units identified as neighboring cooling units to the respective cooling unit may be dynamically identified based on one or more sensed conditions. For example, the one or more of the plurality of cooling units identified as neighboring cooling units to the respective cooling unit may be dynamically defined based on having an actual heat load (e.g. an average heat load over a period of a day, a week, a month or any other suitable time period) that is within a defined heat load range. These are just examples.

The performance level of the respective cooling unit is compared to the performance level of each of the one or more neighboring cooling units, as indicated at block 24*b*. A determination is made that the respective cooling unit has a reduced relative performance level relative to the neighboring cooling units when the performance level of the respective cooling unit falls below the performance level of one or more of the neighboring cooling units by at least a threshold amount, as indicated at block 24*c*. The performance level of the cooling units may be determined using any suitable measure of performance of the cooling unit including, for example, an air flow through an air filter of the cooling unit, a temperature drop across a cooling coil of the cooling unit, a pressure, temperature and/or flow rate of cooling fluid entering and/or exiting the cooling coil of the cooling unit, a fan speed of the cooling unit, an electrical power draw of the cooling unit, and/or any other suitable measure of performance of the cooling unit.

In response to determining that at least one of the respective cooling units has a reduced relative performance level relative to its neighboring cooling units, an alert is issued, as indicated at block 26. In some cases, and as indicated at block 28, the method 20 may further include determining a priority of maintenance for the plurality of cooling units servicing the data center 10 based at least in part on the alert. This can be important because there may be many cooling units servicing a data center 10, such as many tens or even hundreds of cooling units, and performing periodic maintenance on all cooling units may take considerable time. Servicing the cooling units that are determined to have a reduced relative performance first may have the biggest impact on the performance of the data center in the near term and may reduce the chance of a more serious failure of a cooling unit that could result in part of the data center 10 operating under non-compliance conditions or even being taken off-line for service.

Figure 3A:
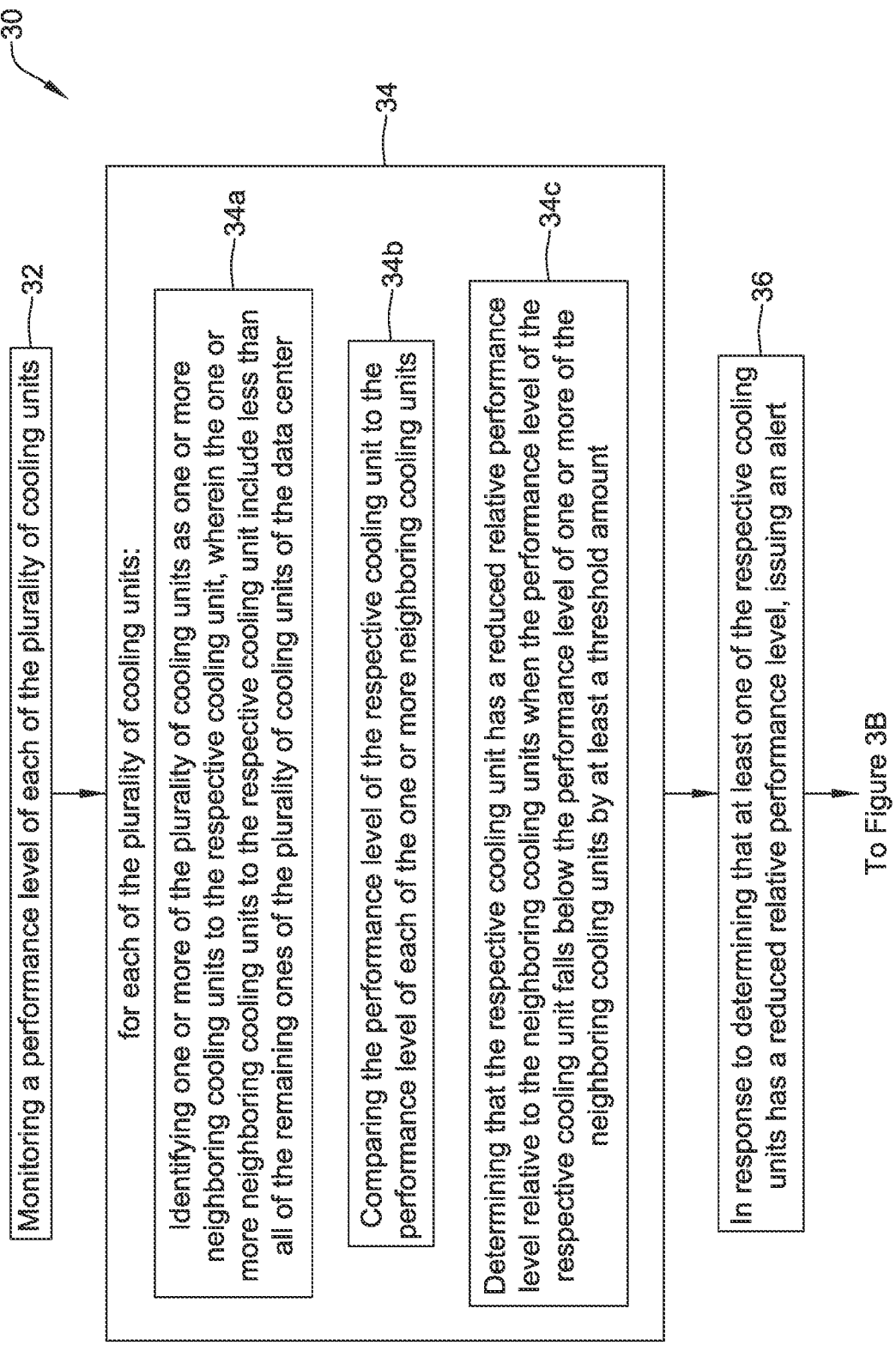
FIGS. 3A and 3B are flow diagrams that together show an illustrative method.
Figure 3B:
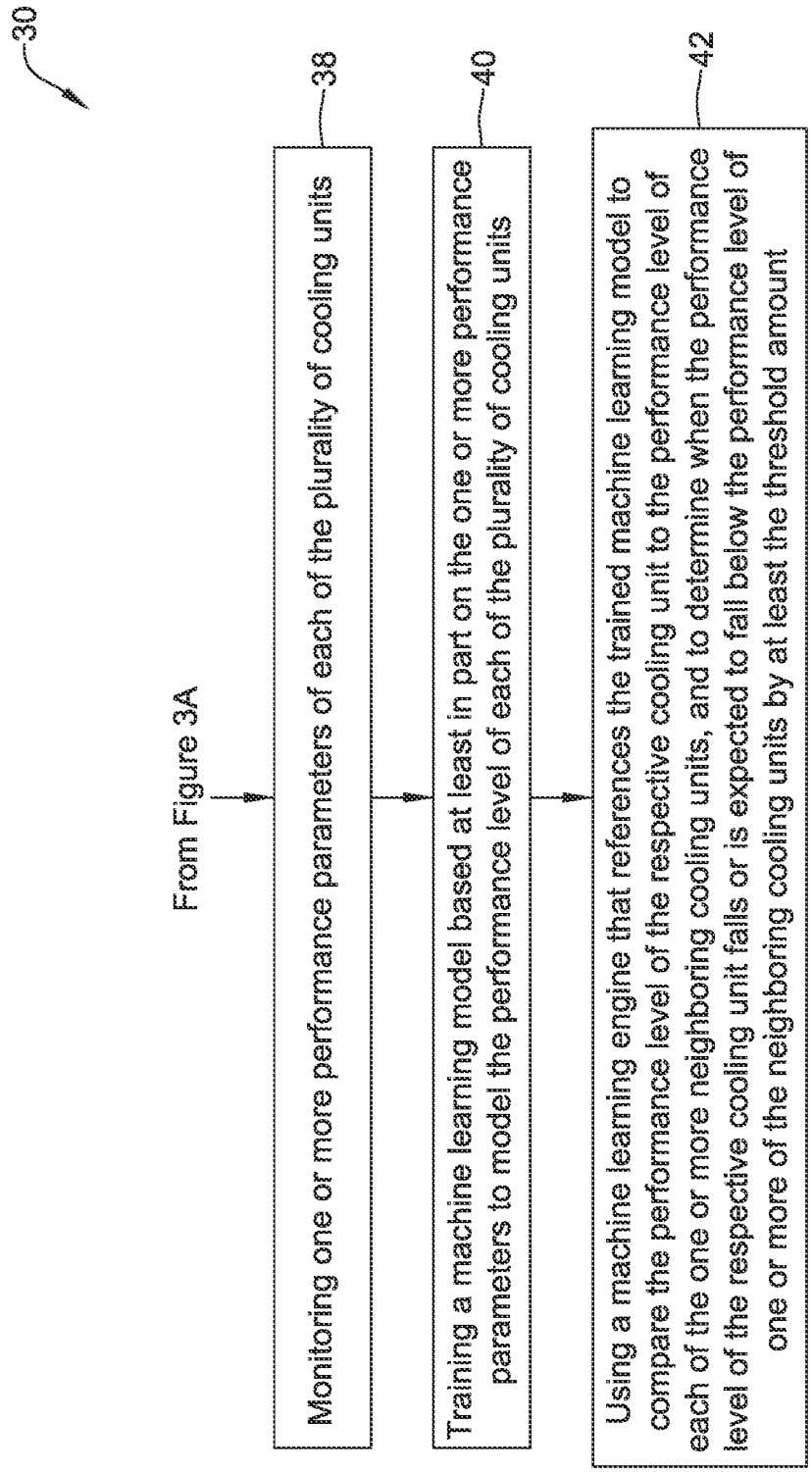

FIGS. 3A and 3B are flow diagrams that together show an illustrative method 30 of identifying one or more cooling units of a plurality of cooling units (such as the cooling units 14) servicing a data center (such as the data center 10) that has a reduced relative performance level relative to other of the plurality of cooling units. The method 30 includes monitoring a performance level of each of the plurality of cooling units, as indicated at block 32. In some cases, the performance level that is monitored may include an airflow parameter indicative of an air flow through an air filter of the respective cooling unit. The performance level that is monitored may include a temperature drop across a cooling coil of the respective cooling unit. These are just examples.

For each of the plurality of cooling units, as indicated at block 34, a number of steps are carried out. One or more of the plurality of cooling units are identified as one or more neighboring cooling units to the respective cooling unit, wherein the one or more neighboring cooling units to the respective cooling unit include less than all of the remaining ones of the plurality of cooling units of the data center, as indicated at block 34*a*. The one or more neighboring cooling units may be defined using any suitable criteria. For example, the one or more of the plurality of cooling units identified as neighboring cooling units to the respective cooling unit may be predefined for each respective cooling unit in advance during commissioning of the data center 10. For example, the one or more of the plurality of cooling units identified as neighboring cooling units to the respective cooling unit may be predefined based on having a nearby physical or logical location to the respective cooling unit, such as on a same floor of the data center 10 and/or in a same zone of the data center 10. In another example, the one or more of the plurality of cooling units identified as neighboring cooling units to the respective cooling unit may be predefined based on having an expected heat load that is within a defined heat load range. In some cases, the one or more of the plurality of cooling units identified as neighboring cooling units to the respective cooling unit may be dynamically identified based on one or more sensed conditions. For example, the one or more of the plurality of cooling units identified as neighboring cooling units to the respective cooling unit may be dynamically defined based on having an actual heat load (e.g. an average heat load over a period of a day, a week, a month or any other suitable time period) that is within a defined heat load range. These are just examples.

The performance level of the respective cooling unit is compared to the performance level of each of the one or more neighboring cooling units, as indicated at block 34*b*. A determination is made that the respective cooling unit has a reduced relative performance level relative to the neighboring cooling units when the performance level of the respective cooling unit falls below the performance level of one or more of the neighboring cooling units by at least a threshold amount, as indicated at block 34*c*. In response to determining that at least one of the respective cooling units has a reduced relative performance level, an alert is issued, as indicated at block 36.

In some cases, and continuing with FIG. 3B, the method 30 may further include monitoring one or more performance parameters of each of the plurality of cooling units, as indicated at block 38. The method 30 may further include training a machine learning model based at least in part on the one or more performance parameters to model the performance level of each of the plurality of cooling units, as indicated at block 40. The method 30 may further include using a machine learning engine that references the trained machine learning model to compare the performance level of the respective cooling unit (which may include a projected performance level based on the trained machine learning model) to the performance level of each of the one or more neighboring cooling units (which may include a projected performance level based on the trained machine learning model), and to determine when the performance level of the respective cooling unit fall or is expected to fall below the performance level of one or more of the neighboring cooling units by at least the threshold amount, as indicated at block 42.

Figure 4A:
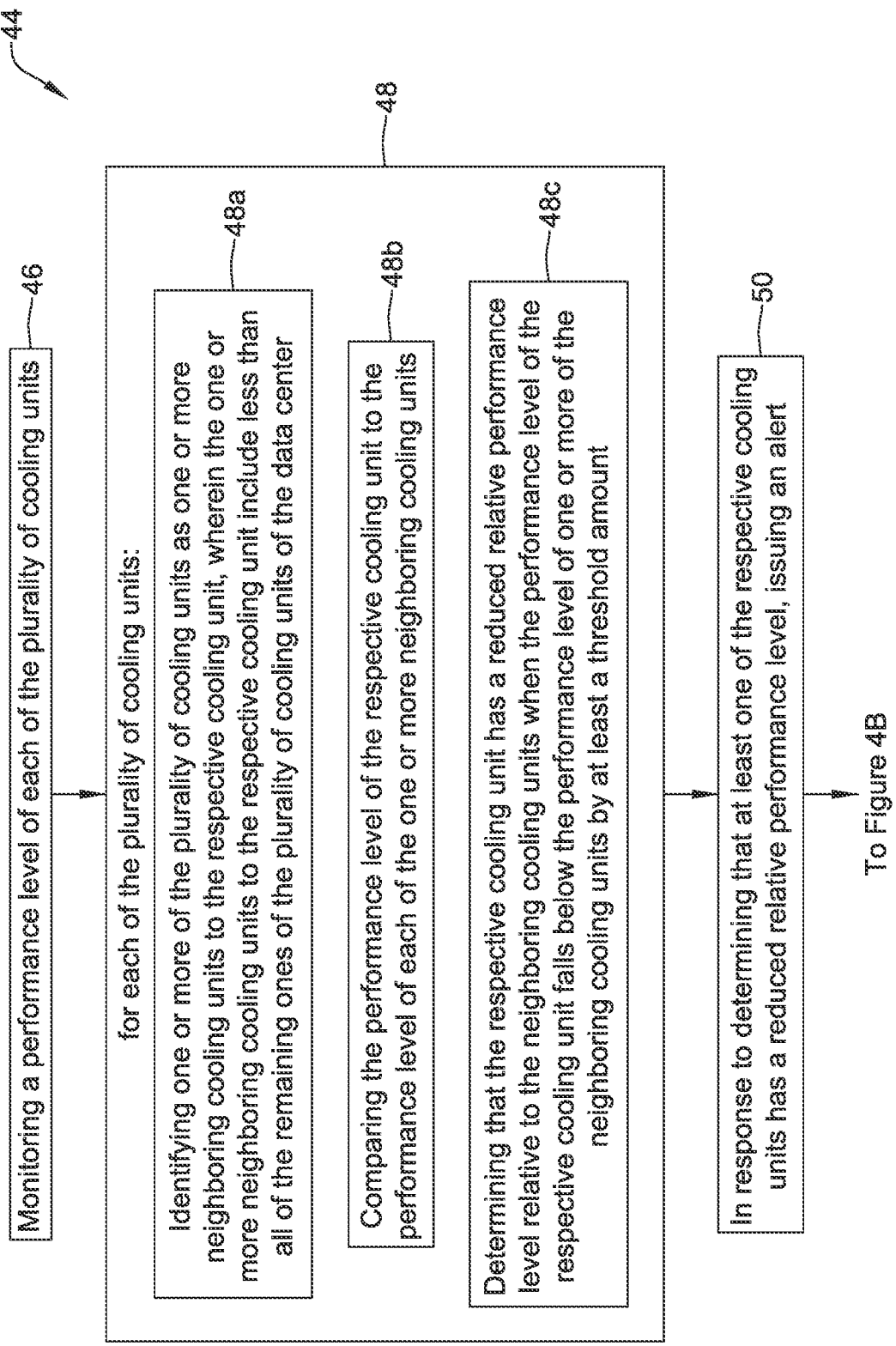
FIGS. 4A and 4B are flow diagrams that together show an illustrative method.
Figure 4B:
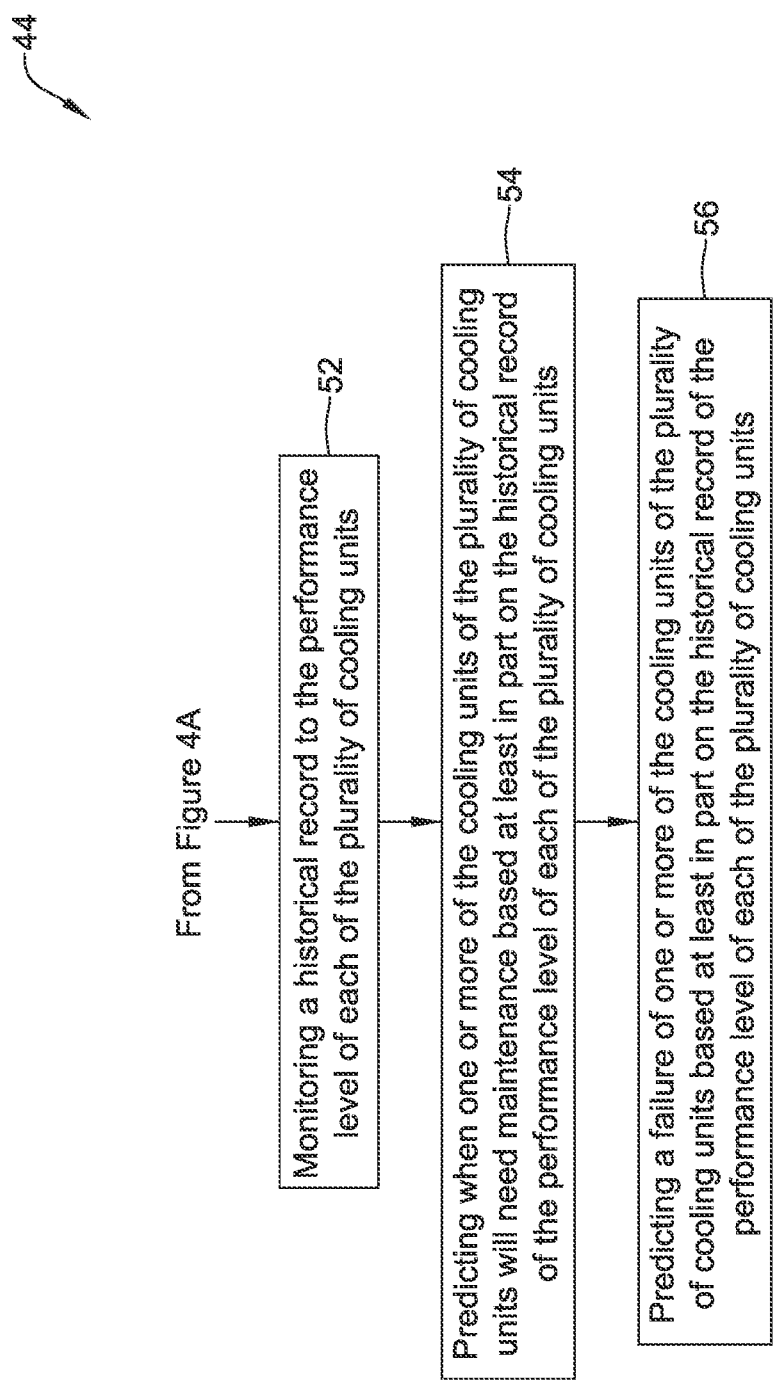

FIGS. 4A and 4B are flow diagrams that together show an illustrative method 44 of identifying one or more cooling units of a plurality of cooling units (such as the cooling units 14) servicing a data center (such as the data center 10) that has a reduced relative performance level relative to other of the plurality of cooling units. The method 44 includes monitoring a performance level of each of the plurality of cooling units, as indicated at block 46. In some cases, the performance level that is monitored may include an airflow parameter indicative of an air flow through an air filter of the respective cooling unit. The performance level that is monitored may include a temperature drop across a cooling coil of the respective cooling unit. These are just examples.

For each of the plurality of cooling units, as indicated at block 48, a number of steps are carried out. One or more of the plurality of cooling units are identified as one or more neighboring cooling units to the respective cooling unit, wherein the one or more neighboring cooling units to the respective cooling unit include less than all of the remaining ones of the plurality of cooling units of the data center, as indicated at block 48a. The one or more neighboring cooling units may be defined using any suitable criteria. For example, the one or more of the plurality of cooling units identified as neighboring cooling units to the respective cooling unit may be predefined for each respective cooling unit in advance during commissioning of the data center 10. For example, the one or more of the plurality of cooling units identified as neighboring cooling units to the respective cooling unit may be predefined based on having a nearby physical or logical location to the respective cooling unit, such as on a same floor of the data center 10 and/or in a same zone of the data center 10. In another example, the one or more of the plurality of cooling units identified as neighboring cooling units to the respective cooling unit may be predefined based on having an expected heat load that is within a defined heat load range. In some cases, the one or more of the plurality of cooling units identified as neighboring cooling units to the respective cooling unit may be dynamically identified based on one or more sensed conditions. For example, the one or more of the plurality of cooling units identified as neighboring cooling units to the respective cooling unit may be dynamically defined based on having an actual heat load (e.g. an average heat load over a period of a day, a week, a month or any other suitable time period) that is within a defined heat load range. These are just examples.

The performance level of the respective cooling unit is compared to the performance level of each of the one or more neighboring cooling units, as indicated at block 48b. A determination is made that the respective cooling unit has a reduced relative performance level relative to the neighboring cooling units when the performance level of the respective cooling unit falls below the performance level of one or more of the neighboring cooling units by at least a threshold amount, as indicated at block 48c. In response to determining that at least one of the respective cooling units has a reduced relative performance level, an alert is issued, as indicated at block 50.

In some cases, and continuing with FIG. 4B, the method 44 may further include maintaining a historical record to the performance level of each of the plurality of cooling units, as indicated at block 52. The method 44 may further include predicting when one or more of the cooling units of the plurality of cooling units will need maintenance based at least in part on the historical record of the performance level of each of the plurality of cooling units, as indicated at block 54. In some cases, the method may include projecting the performance level of the cooling units, and compare the predicted performance level of the respective cooling unit to the predicted performance level of each of the one or more neighboring cooling units, and to determine when the predicted performance level of the respective cooling unit is expected to fall below the predicted performance level of one or more of the neighboring cooling units by at least the threshold amount. In some cases, the method 44 may further include predicting a failure of one or more of the cooling units of the plurality of cooling units based at least in part on the historical record of the performance level of each of the plurality of cooling units, as indicated at block 56.

Figure 5:
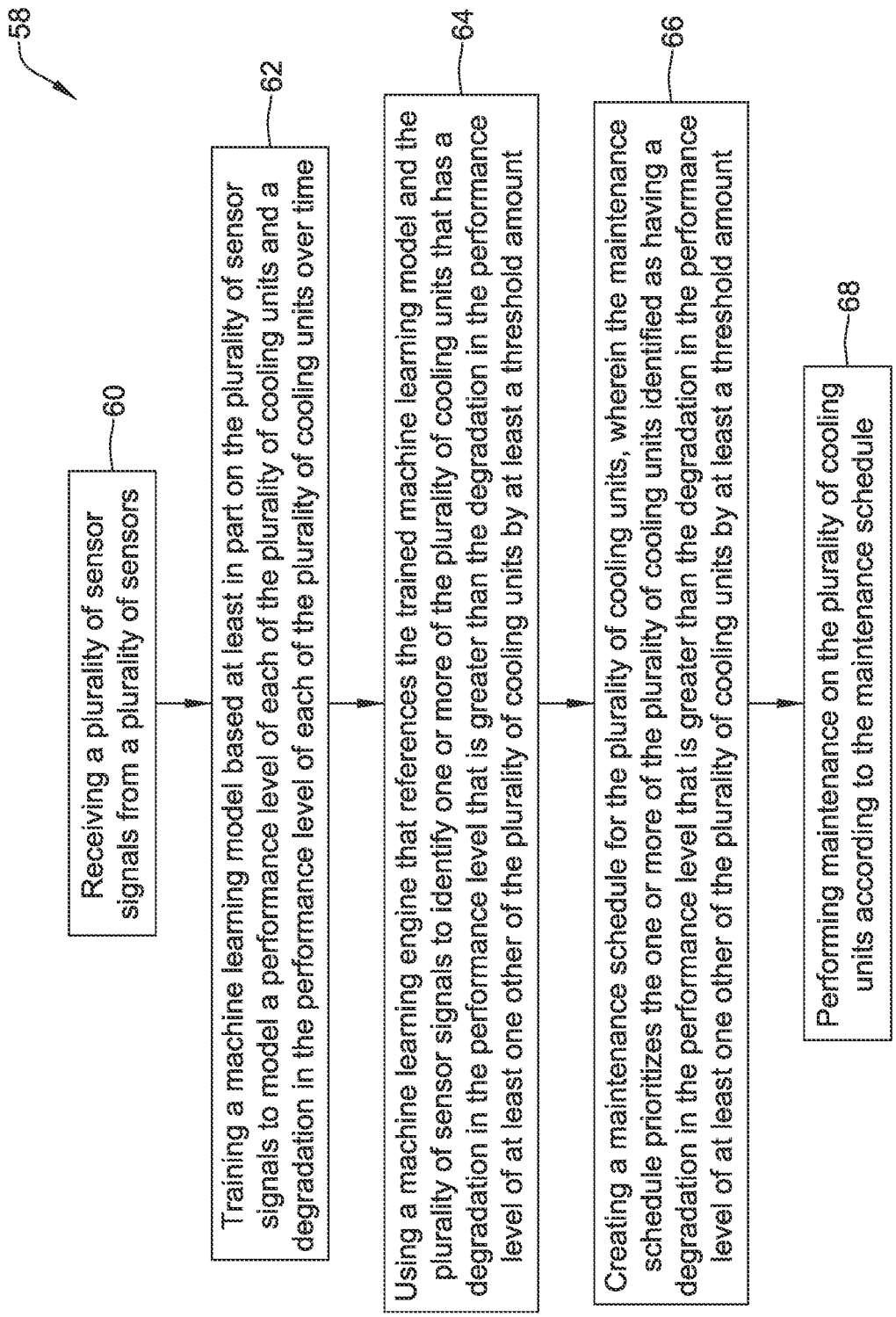
FIG. 5 is a flow diagram showing an illustrative method.

FIG. 5 is a flow diagram showing an illustrative method 58 of scheduling maintenance for a plurality of cooling units (such as the cooling units 14) of a data center (such as the data center 10). In some instances, the plurality of cooling units may be part of a predefined group of cooling units (e.g. neighboring cooling units) of the data center 10, and wherein the data center 10 includes at least one other cooling unit that is not part of the predefined group of cooling units. In some cases, the predefined group of cooling units represent cooling units that service a common zone of the data center, service a common floor of the data center, or service a common heat load (e.g. average heat load is within a defined heat load range).

The illustrative method 58 includes receiving a plurality of sensor signals from a plurality of sensors, as indicated at block 60. In some cases, the plurality of sensor signals may include one or more of a plurality of airflow signals indicative of an air flow through an air filter of each of the plurality of cooling units, and/or a plurality of temperature drop signals indicative of a temperature drop across a cooling coil of each of the plurality of cooling units. These are just examples.

A machine learning model is trained based at least in part on the plurality of sensor signals to model a performance level of each of the plurality of cooling units and a degradation in the performance level of each of the plurality of cooling units over time, as indicated at block 62. In some cases, training the machine learning model occurs during a training mode. A machine learning engine that references the trained machine learning model and the plurality of sensor signals is used to identify one or more of the plurality of cooling units that has a degradation in the performance level (which may include a projected degradation in the performance level based on the trained machine learning model) that is greater than the degradation in the performance level (which may include a projected degradation in the performance level based on the trained machine learning model) of at least one other of the plurality of cooling units in the predefined group of cooling units by at least a threshold amount, as indicated at block 64. In some cases, this occurs during an operational mode.

A maintenance schedule is created for the plurality of cooling units, wherein the maintenance schedule prioritizes the one or more of the plurality of cooling units identified as having a degradation in the performance level that is greater than the degradation in the performance level of at least one other of the plurality of cooling units in the predefined group by at least a threshold amount, as indicated at block 66. Maintenance is performed on the plurality of cooling units according to the maintenance schedule, as indicated at block 68.

Figure 6:
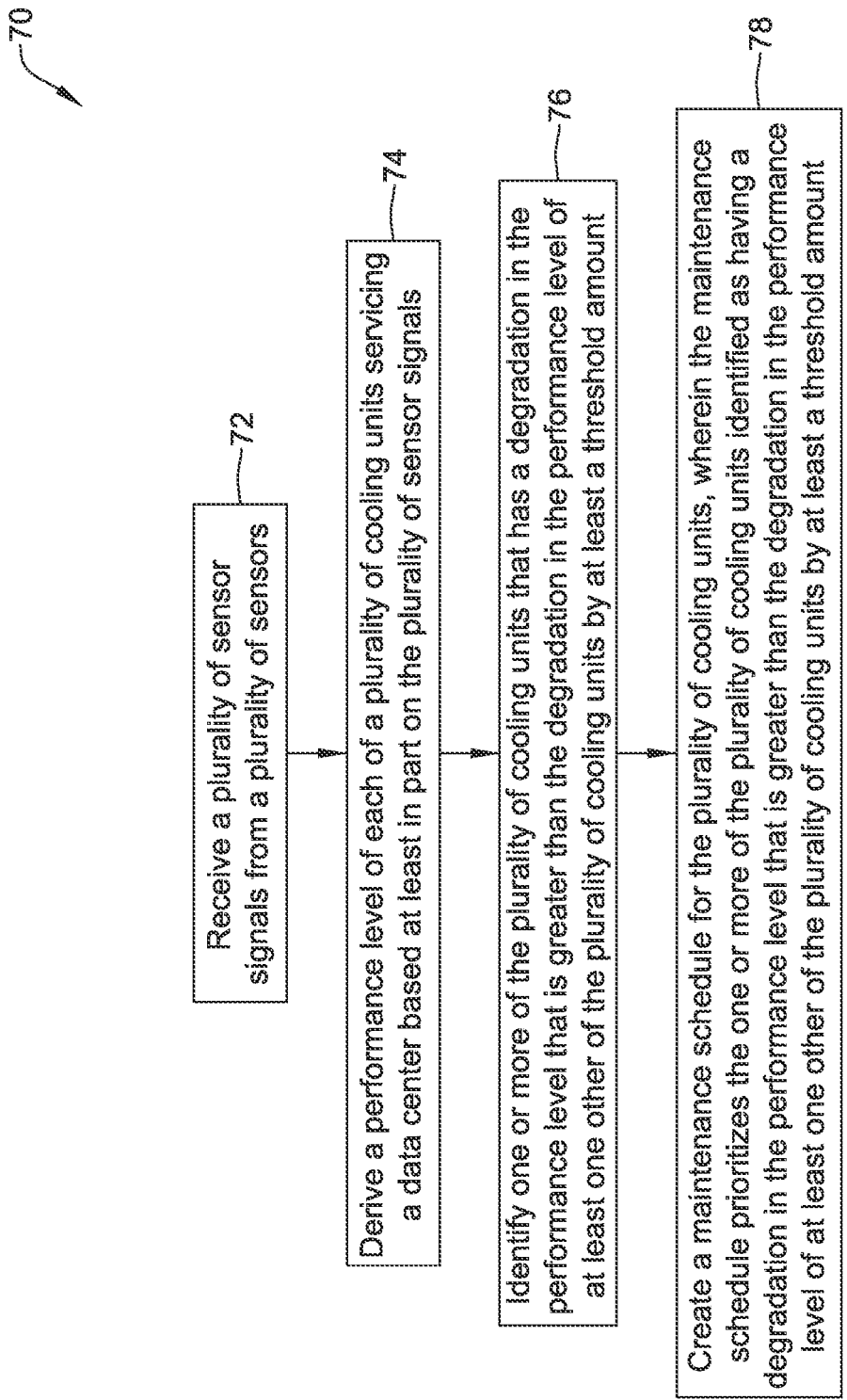
FIG. 6 is a flow diagram showing an illustrative method.

FIG. 6 is a flow diagram showing an illustrative series of steps 70 that may be carried out by one or more processors when executing instructions that are stored on a non-transient, computer readable storage medium. The one or more processors may be caused to receive a plurality of sensor signals from a plurality of sensors, as indicated at block 72. The one or more processors may be caused to derive a performance level of each of a plurality of cooling units servicing a data center based at least in part on the plurality of sensor signals, as indicated at block 74. The one or more processors may be caused to identify one or more of the plurality of cooling units that has a degradation in the performance level that is greater than the degradation in the performance level of at least one other of the plurality of cooling units by at least a threshold amount, as indicated at block 76.

In some cases, the one or more processors may be caused to identify the plurality of cooling units from a larger set of cooling units that service the data center, wherein the plurality of cooling units represent cooling units that service a common zone of the data center, service a common floor of the data center, or service a common heat load (e.g. average heat load over a period of time that is within a defined heat load range). The one or more processors may be caused to create a maintenance schedule for the plurality of cooling units, wherein the maintenance schedule prioritizes the one or more of the plurality of cooling units identified as having a degradation in the performance level that is greater than the degradation in the performance level of at least one other of the plurality of cooling units by at least a threshold amount, as indicated at block 78.

Figure 7:
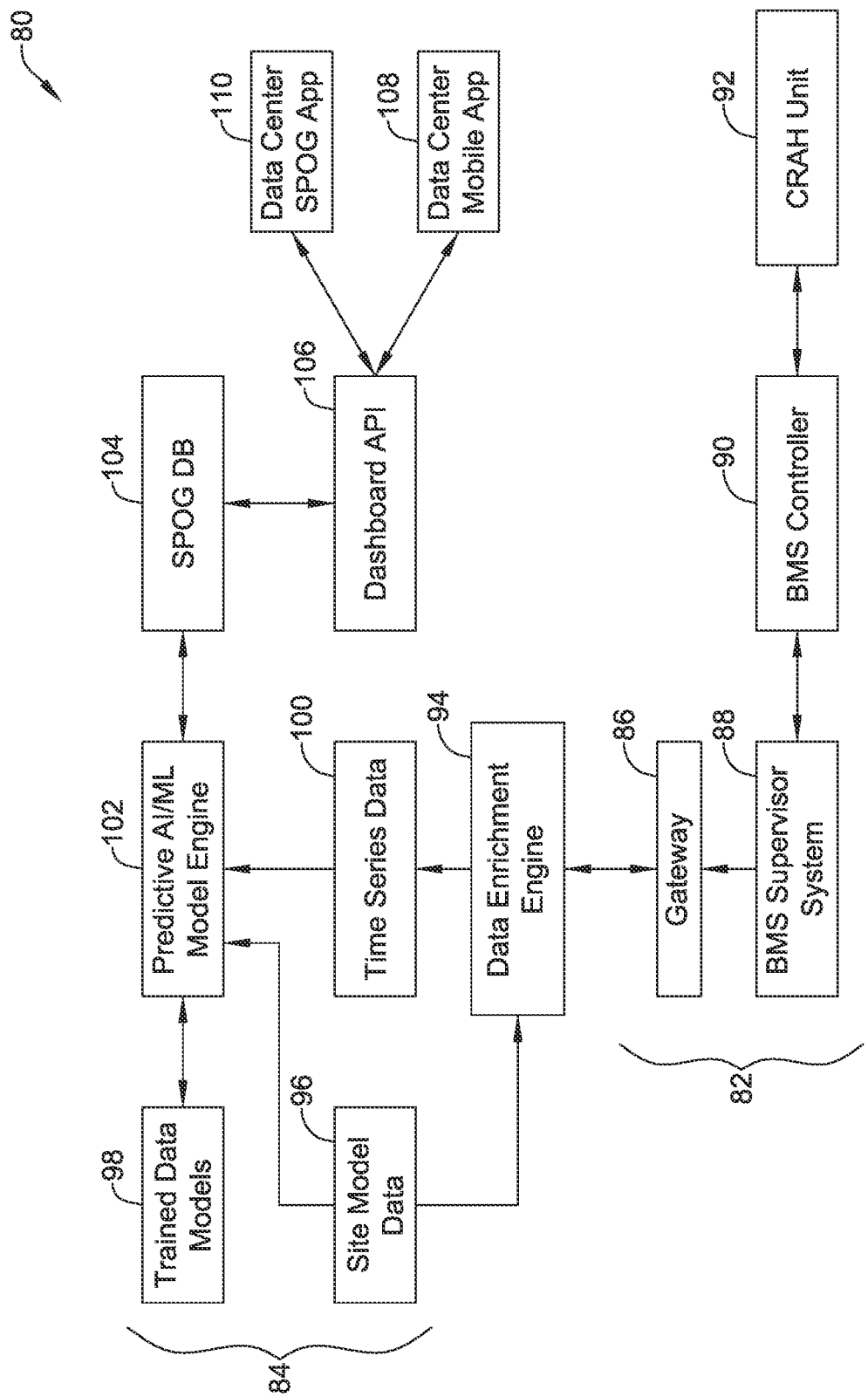
FIG. 7 is a schematic block diagram showing an illustrative control system for the illustrative data center of FIG. 1.

FIG. 7 is a schematic block diagram showing an illustrative system 80 that may be considered as being divided into an edge, or local, component 82 and a cloud, or remote, component 84. Within the local component 82, an edge gateway 86 collects data from a Building Management System (BMS) Supervisor System 88, which itself collects data from a BMS controller 90. The BMS controller 90 receives data from, and controls operation of, a cooling unit such as a CRAH unit 92.

In the example shown, the cloud component 84 includes a data enrichment engine 94 that communicates with the edge gateway 86. The data enrichment engine 94 also provides data to a Site Model Data block 96, a Trained Data Models block 98 and a Time Series Data block 98. The Site Model Data block 96, the Trained Data Models block 98 and the Time Series Data block 100 each provide information to a Predictive AI (artificial intelligence)/ML (machine learning) Model Engine 102. The Predictive AI/ML Model Engine 102 communicates with a SPOG database 104, which itself communicates with a dashboard 106. It will be appreciated that the dashboard 106 may be accessed via either a data center mobile application 108 or a data center SPOG application 110.

Figure 8:
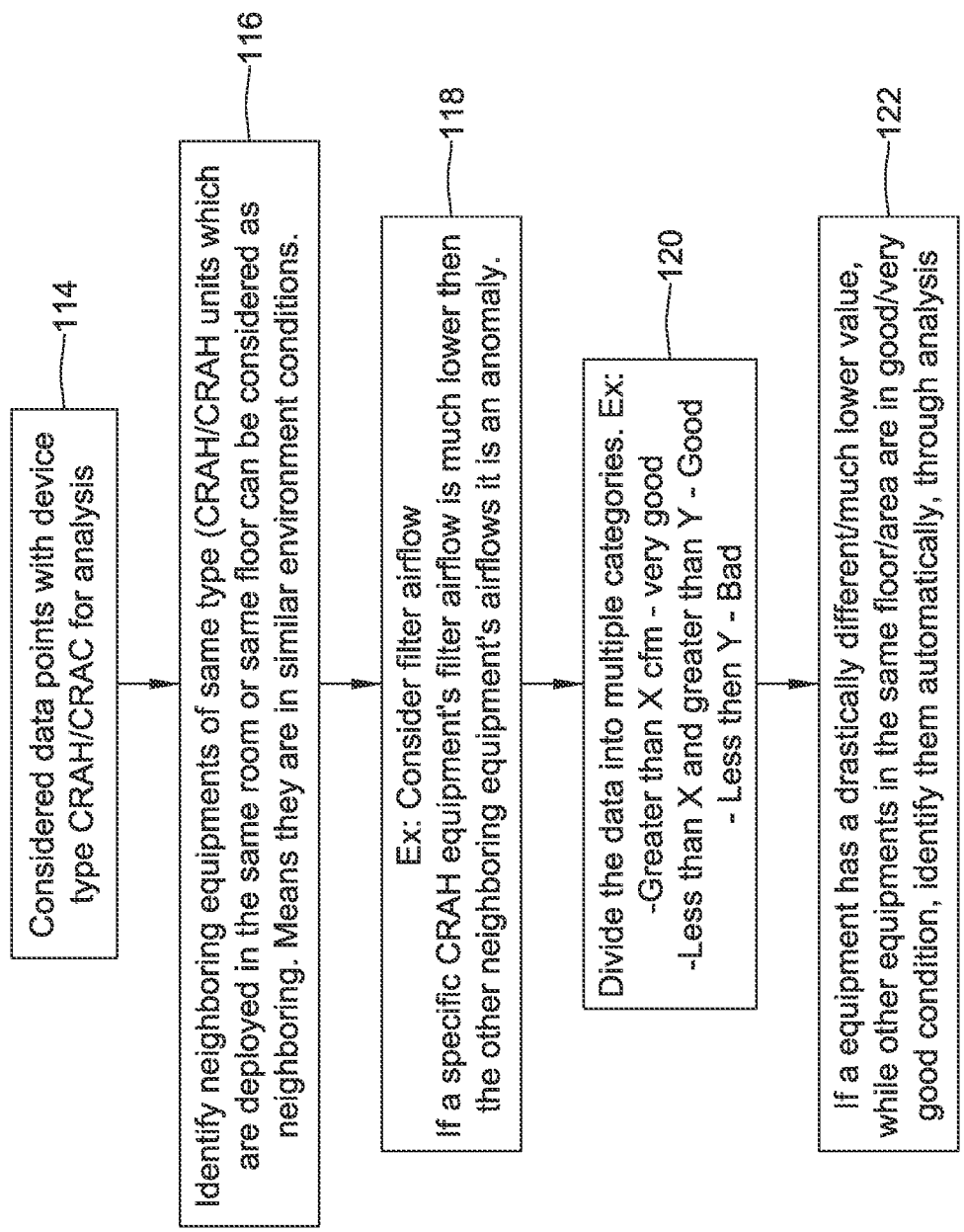
FIG. 8 is a flow diagram showing an illustrative method.

FIG. 8 is a flow diagram showing an illustrative sample anomaly prediction method 112. The method 112 includes considering cooling unit data for analysis, as indicated at block 114. Cooling units that are similar, and that are neighboring, are identified, as indicated at block 116. The method 112 includes looking for anomalies, as indicated at block 118. As an example, if a particular CRAH unit has a filter airflow value that is much lower than that of neighboring CRAH units, this is considered an anomaly. The data is categorized as good, very good or bad, as indicated at block 120. In some cases, equipment that has substantially lower values than other equipment in the same area, this equipment may be automatically identified as problematic, as indicated at block 122.

Figure 9A:
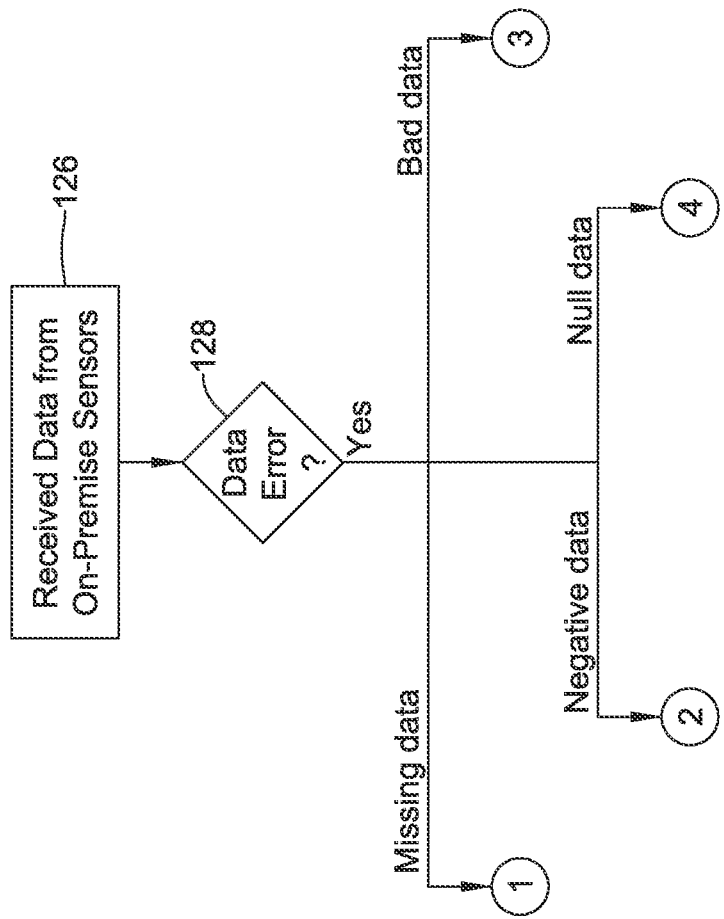
FIGS. 9A and 9B are flow diagrams that together show an illustrative method.
Figure 9B:
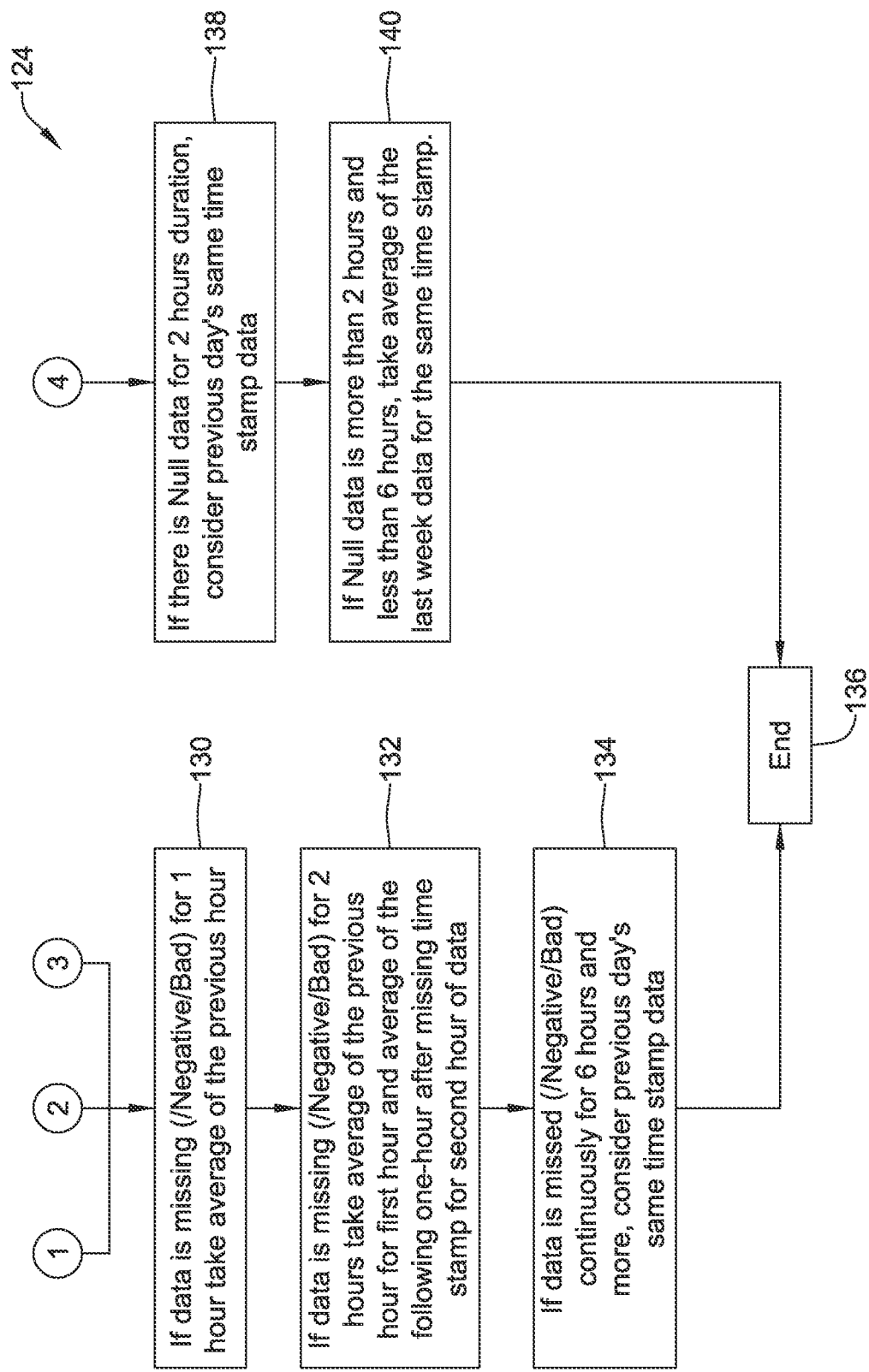

FIGS. 9A and 9B are flow diagrams that together show an illustrative method 124 of data enrichment. In some cases, the method 124 of data enrichment may be carried out via the data enrichment engine 94 of FIG. 7. Data is received from sensors, as indicated at block 126. At decision block 128, a determination is made as to whether any of the received data is missing, bad, negative or null. If not, the data is processed normally. If any of the received data is determined to include missing data, control passes to point "1". If any of the received data is determined to include negative data, control passes to point "2". If any of the received data is determined to include bad data, control passes to point "3". If any of the received data is determined to include null data, control passes to point "4".

The method 124 continues in FIG. 9B. If any of the received data was determined to include missing data, negative data or bad data for up to one hour, control passes to block 130, where an average value for the previous hour is determined. If any of the received data was determined to include missing data, negative data or bad data for up to two hours, control passes to block 132, where an average value for the previous hour is taken for the first hour of missing data and an average value for a following hour is taken for the second hour of missing data. If any of the received data was determined to include missing data, negative data or bad data for more than six hours, control passes to block 134, where an average value for the previous day is determined. Control then passes to an end block 136.

If there was a determination of null data for up to two hours duration, control passes to block 138, where a previous day's data for the same time period is used. If the null data exceeds two hours, but not more than six hours, an average is taken of the previous week's data for the same time period, as indicated at block 140.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A method of identifying one or more cooling units of a plurality of cooling units servicing a data center that has a reduced relative performance level relative to other of the plurality of cooling units, the method comprising:
   monitoring a performance level of each of the plurality of cooling units, wherein the performance level of each of the plurality of cooling units is defined at least in part by one or more performance level parameters including one or more of:
   an airflow parameter representative of an airflow through an air filter of the respective cooling unit;
   a temperature drop parameter representative of a temperature drop across a cooling coil of the respective cooling unit;
   a pressure, temperature and/or flow rate parameter of a cooling fluid of the respective cooling unit;
   a fan speed parameter representative to a fan speed of a fan of the respective cooling unit;
   an electrical power draw parameters representative of a power draw of the respective cooling unit;
   for each of the plurality of cooling units:
   identifying one or more of the plurality of cooling units as one or more neighboring cooling units to the respective cooling unit, wherein the one or more neighboring cooling units include less than all of the remaining ones of the plurality of cooling units of the data center, wherein the one or more neighboring cooling units include one or more of:
   cooling units of the plurality of cooling units that have a predefined physical proximity to the respective cooling unit in the data center;
   cooling units of the plurality of cooling units that service a common zone of the data center as the respective cooling unit; and
   cooling units that have an average heat load that is within a predefined heat load range of the respective cooling unit;

comparing degradation in the performance level of the respective cooling unit to the degradation in the performance level of each of the one or more neighboring cooling units by comparing one or more of the performance level parameters of the respective cooling unit to respective performance level parameters of each of the one or more neighboring cooling units;

determining that the respective cooling unit has a reduced relative performance level relative to the performance level of the neighboring cooling units when the degradation in performance level of the respective cooling unit falls below the degradation in performance level of one or more of the neighboring cooling units by at least a threshold amount; and in response to determining that at least one of the respective cooling units has a reduced relative performance level, correcting the at least one of the respective cooling units that has a reduced relative performance level before performing periodic maintenance on a cooling unit of the plurality of cooling units that does not have a reduced relative performance level.

2. The method of claim 1, further comprising:
determining a priority of maintenance for the plurality of cooling units servicing the data center based at least in part on the alert.

3. The method of claim 1, wherein the one or more neighboring cooling units and the respective cooling unit all service a common zone of the data center.

4. The method of claim 3, wherein the common zone corresponds to a common floor of the data center.

5. The method of claim 1, wherein the one or more neighboring cooling units and the respective cooling unit all service a common geographic region of the data center, wherein at least one of the plurality of cooling units that is not one of the one or more neighboring cooling units services a geographic region of the data center than is outside of the common geographic region.

6. The method of claim 1, wherein the one or more neighboring cooling units and the respective cooling unit all have an average heat load that is within the predefined heat load range.

7. The method of claim 1, wherein the one or more performance level parameters comprises the airflow parameter that is representative of an airflow through the air filter of the respective cooling unit.

8. The method of claim 1, wherein the one or more performance level parameters comprises the temperature drop parameter that is representative of the temperature drop across the cooling coil of the respective cooling unit.

9. The method of claim 1, further comprising:
training a machine learning model based at least in part on the one or more of the performance parameters to model the degradation in performance level of each of the plurality of cooling units; and using a machine learning engine that references the trained machine learning model to compare the degradation in performance level of the respective cooling unit to the degradation in performance level of each of the one or more neighboring cooling units, and to determine when the degradation in performance level of the respective cooling unit fall or is expected to fall below the degradation in performance level of one or more of the neighboring cooling units by at least the threshold amount.

10. The method of claim 1, wherein the one or more of the plurality of cooling units identified as neighboring cooling units to the respective cooling unit are predefined.

11. The method of claim 1, wherein the one or more of the plurality of cooling units identified as neighboring cooling units to the respective cooling unit are dynamically identified.

12. The method of claim 1, further comprising:
maintaining a historical record to the degradation in performance level of each of the plurality of cooling units; and predicting when one or more of the cooling units of the plurality of cooling units will need maintenance based at least in part on the historical record of the degradation in performance level of each of the plurality of cooling units.

13. The method of claim 12, further comprising:
predicting a failure of one or more of the cooling units of the plurality of cooling units based at least in part on the historical record of the degradation in performance level of each of the plurality of cooling units.

14. A method of scheduling maintenance for a plurality of cooling units of a data center, the method comprising:
receiving a plurality of sensor signals from a plurality of sensors;

training a machine learning model based at least in part on the plurality of sensor signals to model a performance level of each of the plurality of cooling units and a degradation in the performance level of each of the plurality of cooling units over time;

for each of the plurality of cooling units, identifying one or more of the plurality of cooling units as one or more neighboring cooling units to the respective cooling unit, wherein the one or more neighboring cooling units include less than all of the remaining ones of the plurality of cooling units of the data center, wherein the one or more neighboring cooling units include one or more of:

cooling units of the plurality of cooling units that have a predefined physical proximity to the respective cooling unit in the data center;

cooling units of the plurality of cooling units that service a common zone of the data center as the respective cooling unit; and cooling units that have an average heat load that is within a predefined heat load range of the respective cooling unit;

using a machine learning engine that references the trained machine learning model and the plurality of sensor signals to identify one or more of the plurality of cooling units that has a degradation in the performance level that is greater than the degradation in the performance level of the identified one or more neighboring cooling units by at least a threshold amount;

creating a maintenance schedule for the plurality of cooling units, wherein the maintenance schedule prioritizes the one or more of the plurality of cooling units identified as having a degradation in the performance level that is greater than the degradation in the performance level of at least one of the one or more neighboring cooling units by at least a threshold amount; and performing maintenance on the plurality of cooling units according to the maintenance schedule.

15. The method of claim 14, wherein the plurality of sensor signals include one or more of:

a plurality of airflow signals indicative of an air flow through an air filter of each of the plurality of cooling units; and a plurality of temperature drop signals indicative of a temperature drop across a cooling coil of each of the plurality of cooling units.

16. The method of claim 14, wherein training the machine learning model occurs during a training mode, and wherein using the machine learning engine to identify one or more of the plurality of cooling units that has a degradation in the performance level that is greater than the degradation in the performance level of the identified one or more neighboring cooling units by at least a threshold amount occurs in an operation mode.

17. A non-transient computer readable medium storing instructions thereon that when executed by one or more processors cause the one or more processors to:

receive a plurality of sensor signals from a plurality of sensors;

derive a performance level of each of a plurality of cooling units servicing a data center based at least in part on the plurality of sensor signals;

for each of the plurality of cooling units, identify one or more of the plurality of cooling units as one or more neighboring cooling units to the respective cooling unit, wherein the one or more neighboring cooling units include less than all of the remaining ones of the plurality of cooling units of the data center, and wherein the one or more neighboring cooling units include one or more of:

cooling units of the plurality of cooling units that have a predefined physical proximity to the respective cooling unit in the data center;

cooling units of the plurality of cooling units that service a common zone of the data center as the respective cooling unit; and cooling units that have an average heat load that is within a predefined heat load range of the respective cooling unit;

identify one or more of the plurality of cooling units that has a degradation in the performance level that is greater than the degradation in the performance level of at least one of the one or more identified neighboring cooling units by at least a threshold amount; and create a maintenance schedule for the plurality of cooling units, wherein the maintenance schedule prioritizes the one or more of the plurality of cooling units identified as having a degradation in the performance level that is greater than the degradation in the performance level of at least one of the one or more identified neighboring cooling units by at least a threshold amount.

* * * * *